(12) United States Patent
Li et al.

(10) Patent No.: US 7,254,059 B2
(45) Date of Patent: Aug. 7, 2007

(54) MULTILEVEL PHASE-CHANGE MEMORY ELEMENT AND OPERATING METHOD

(75) Inventors: Chien-Ming Li, Hsinchu (TW);
Wen-Han Wang, Hsinchu (TW);
Kuei-Hung Shen, Hsinchu (TW)

(73) Assignee: Industrial Technology Research Institut, Hsinchu (TW)

( * ) Notice: Subject to any disclaimer, the term of this patent is extended or adjusted under 35 U.S.C. 154(b) by 0 days.

(21) Appl. No.: 11/182,783

(22) Filed: Jul. 18, 2005

(65) Prior Publication Data
US 2006/0077706 A1    Apr. 13, 2006

(30) Foreign Application Priority Data
Oct. 8, 2004   (TW)   ............................. 93130600 A

(51) Int. Cl.
*G11C 11/34* (2006.01)
(52) U.S. Cl. ................... 365/185.03; 365/163
(58) Field of Classification Search ........... 365/161, 365/163, 185.03, 46, 148; 257/1, 2
See application file for complete search history.

(56) References Cited
U.S. PATENT DOCUMENTS

| | | | |
|---|---|---|---|
| 6,141,241 A * | 10/2000 | Ovshinsky et al. | ......... 365/163 |
| 6,339,544 B1 * | 1/2002 | Chiang et al. | ............ 365/163 |
| 6,635,914 B2 | 10/2003 | Kozicki et al. | ............ 257/296 |
| 7,106,623 B2 * | 9/2006 | Hung et al. | ................ 365/163 |
| 2005/0191804 A1 * | 9/2005 | Lai et al. | .................... 438/238 |
| 2006/0077741 A1 * | 4/2006 | Wang et al. | ............... 365/222 |
| 2006/0091374 A1 * | 5/2006 | Yoon et al. | .................. 257/2 |
| 2006/0097239 A1 * | 5/2006 | Hsiung | ....................... 257/4 |
| 2006/0166455 A1 * | 7/2006 | Gordon et al. | ............ 438/385 |
| 2006/0226411 A1 * | 10/2006 | Lee | .............................. 257/2 |

OTHER PUBLICATIONS

Ed Spall, Ovonyx, "Ovonic Unified Memory," Presentation to IEEE Electron Device Society, May 22, 2001.

* cited by examiner

*Primary Examiner*—Anh Phung
*Assistant Examiner*—Alexander Sofocleous
(74) *Attorney, Agent, or Firm*—Rabin & Berdo, P.C.

(57) ABSTRACT

A multilevel phase change memory element and operating method and electrodes, which are configured in a parallel structure to form a memory cell. A voltage-drive mode is employed to control and drive the memory element such that multilevel memory states may be achieved by imposing different voltage levels. The provided multilevel phase-change memory element has more bits and higher capacity than that of a memory element with a single phase-change layer.

23 Claims, 13 Drawing Sheets

MULTILEVEL PHASE-CHANGE MEMORY ELEMENT AND OPERATING METHOD

This application claims the benefit of Taiwan Patent Application No. 93130600, filed on Oct. 8, 2004, which is hereby incorporated by reference for all purposes as if fully set forth herein.

BACKGROUND OF THE INVENTION

1. Field of Invention

The invention relates to a semiconductor memory device, and more particularly to a semiconductor memory element with a multi-level memory state.

2. Related Art

Memory is widely used in general electric devices. Most are DRAM, SRAM, or Flash memory. Application and architecture of electric devices determine the usage of the memory and the required capacity. Development of memory technology, such as FeRAM, MRAM and phase change memory technology, is ongoing.

A phase change semiconductor memory element stores data through resistance variation caused by phase change of materials. Regarding the phase materials, in the 1960s, S. R. Ovshinsky of the U.S. company ECD discovered that crystallization and amorphization of chalcogenide has a distinct difference in optics and electrical conductivity. It is capable of fast reversible transformation and has switching/memory application.

A phase change memory element is called a semiconductor memory because chalcogenide belongs to the VIA group in the Periodic Table Of Elements, and is a semiconductive material between metals and nonmetals. Adding some elements is required for specific purposes in practical use, for example, increasing amorphization/crystallization speed, or crystallization characteristics.

Phase change memories meet the need for large and fast storage operations and long storage time. It has the advantages of small volume, more storage data, and fast operation speed, and may store data more than ten years under 130° C. Therefore, a phase change memory element is a non-volatile memory element with great potential, having high read/write speed, high integrity, long endurance, low power consumption, and radiation hardness. Main technology trends focuses on higher record density and low power consumption through reducing memory cells.

However, besides increasing the memory density by reducing the area, multi-level/multi-state memory is another consideration. Thus, a single memory cell may have more than two memory states in the condition of not changing the component size.

In the related art, Tyler Lowrey (Ovonyx Inc.) provides a multi-state structure in a published company technology document. A memory cell with a single phase change layer is employed to obtain multi levels with different resistant values by controlling the reset current. However, the solution may have the problem of small current separation such that writing error occurs due to the current offset.

Also, U.S. Pat. No. 6,635,914 discloses a four level memory cell that belongs to the category of Programmable Metallization Cell Memory (PMCm). The cell is composed of a solid electrolyte layer and two electrodes. The conductivity of the solid electrolyte layer is changed by delivering an electrical field by the electrodes.

Phase change memory, MRAM, and FRAM are the main memory technology trends, which have the advantages of being non-volatile, high speed (close to the operation speed of DRAM and SRAM), large capacity, high integrity, high environment endurance, long storage time, etc. Furthermore, operation voltage is decreasing gradually. These memories may substitute Flash memory in the near future. Therefore, there is an urgent need for a new phase change memory element structure.

SUMMARY OF THE INVENTION

Accordingly, the invention relates to a multilevel phase-change memory element, its manufacture method and its operating method that substantially solves the problems of the related art.

An object of the invention is to provide a multilevel phase-change memory element, its manufacture method and its operating method having four memory states through one single memory cell.

Another object of the invention is to provide a multilevel phase-change memory element, its manufacture method and its operating method, in which the memory cell is configured by two independent phase change units formed in parallel in order to obtain a memory cell with high density. The materials of the phase change units may be the same or different.

Additional features and advantages of the invention will be set forth in the following description, and in part will be apparent from the description, or may be learned by practice of the invention. The objectives and other advantages of the invention will be realized and attained by the structure explained in the written description and claims hereof as well as the appended drawings.

To achieve these and other advantages and in accordance with the purpose of the invention, as embodied and broadly described herein, a phase change memory element includes a first phase change layer having a crystalline state or an amorphous state; a second phase change layer having a crystalline state or an amorphous state; a first top electrode and a second top electrode formed on one surface of the first phase change layer and the second phase change layer respectively for delivering electrical signals to change the states of the first phase change layer and the second phase change layer; and at least one bottom electrode formed on another surface of the first phase change layer and the second phase change layer.

According to the object of the invention, the phase change memory element has the advantage of multilevel memory states in one single cell.

According to the object of the invention, the phase change memory element has the advantage of definite reading separation for the multilevel memory states.

According to the object of the invention, the phase change memory element has the advantage of transferring the memory state thorough one or two operation steps.

Further scope of applicability of the invention will become apparent from the detailed description given hereinafter. However, it should be understood that the detailed description and specific examples, while indicating embodiments of the invention, are given by way of illustration only and are intended to provide further explanation of the invention as claimed, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 9 and 10 show selecting elements connected to the phase change memory element according to the invention.

DETAILED DESCRIPTION OF THE INVENTION

Reference will now be made in detail to an embodiment of the invention, examples of which are illustrated in the accompanying drawings. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
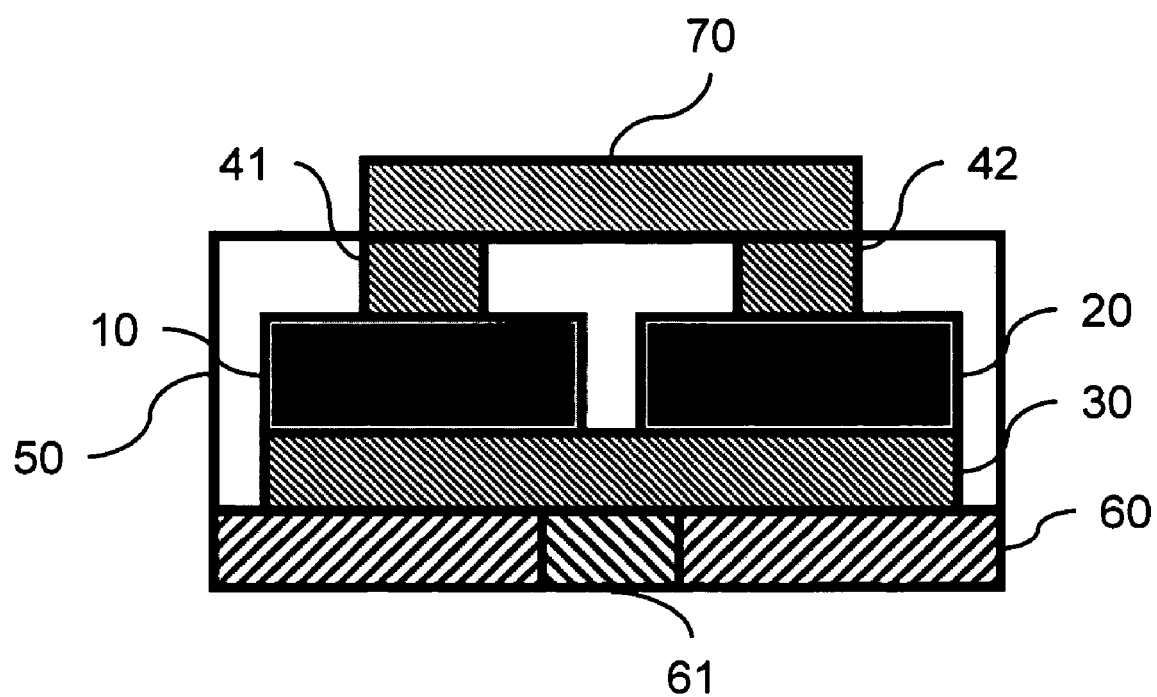
FIG. 1 is a structure diagram of the phase change memory element according to the invention.

Refer to FIG. 1, which illustrates the structure of the phase change memory element of the invention. In the embodiment, the phase change memory element includes a first phase change layer 10, a second phase change layer 20, a bottom electrode 30, a first top electrode 41 and a second top electrode 42. The first phase change layer 10 and the second phase change layer 20 are formed on the bottom electrode 30 by a semiconductor process. The first top electrode 41 is formed on the first phase change layer 10 by a semiconductor process. The second top electrode 42 is formed on the second phase change layer 20 by a semiconductor process.

Figure 10:
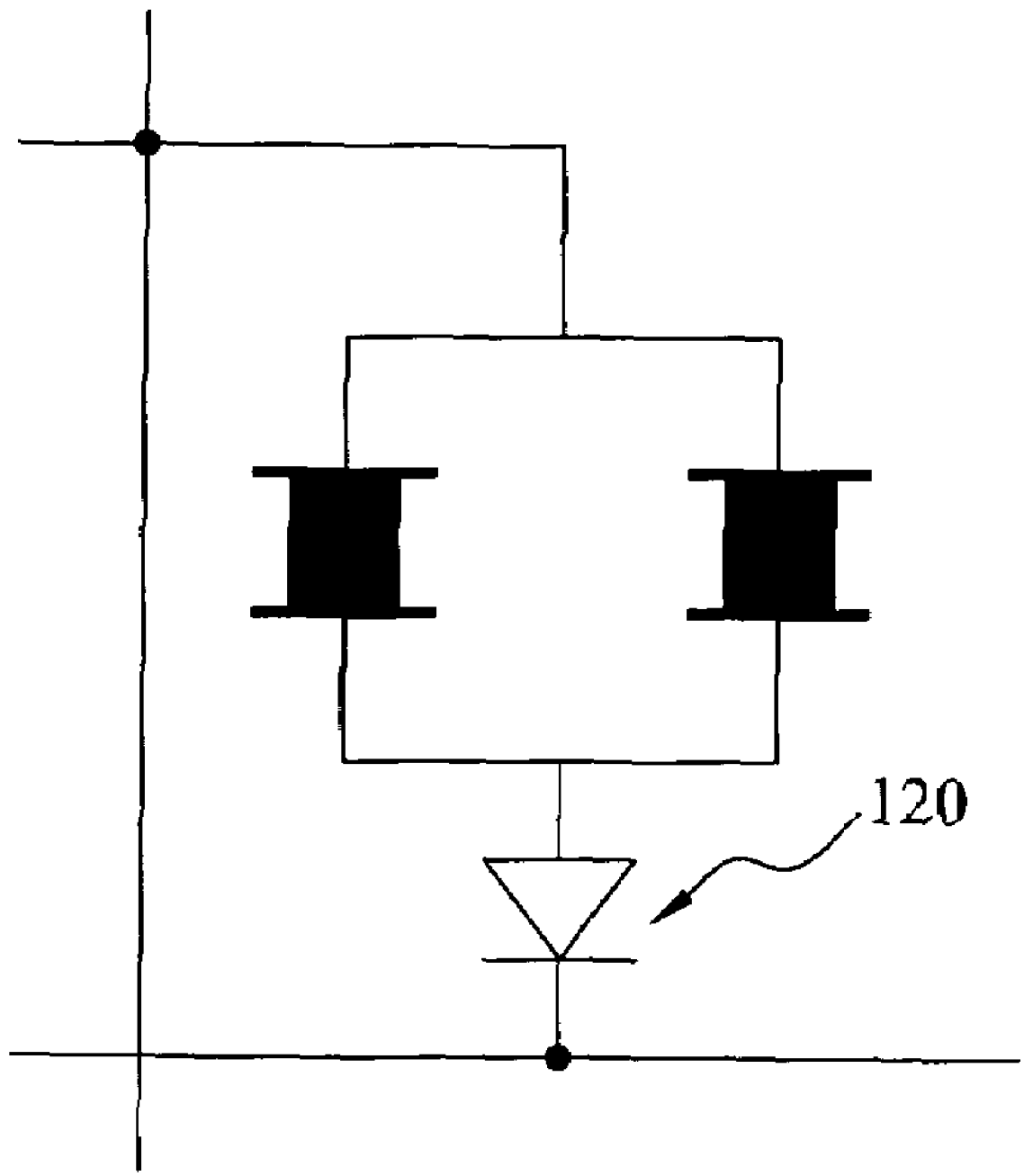

In another embodiment, a protection layer 50 is formed from dielectric material by a semiconductor process to cover and protect the first phase change layer 10, the second phase change layer 20, the bottom electrode 30, the first top electrode 41 and the second top electrode 42. In another embodiment, the bottom electrode 30 is formed on a substrate 60, in which a metal contact 61 is formed for connecting to a selecting element. which may be a MOSFET 110 or a diode 120 (see FIGS. 9 and 10) needed for operation. The substrate 60 is formed in the former process for COMS or Bipolar transistors. In another embodiment, a metal line 70 is formed on the protection layer 50 and makes contact with the first top electrode 41 and the second top electrode 42 for delivering voltage or current signals such that the first phase change layer 10 and the second phase change layer 20 are heated to change the state through the electrical signals; thereby controlling the operation of the phase change memory element in accordance with the invention.

According to the principle of the invention, two phase change layers are employed and connected in parallel to form one single memory cell. Each phase change layer has a crystalline state and an amorphous state, which may be changed by heating. The first phase change layer 10 has a crystalline state and an amorphous state, while the second phase change layer 20 has a crystalline state and an amorphous state. Thus four states are formed when the two phase change layers are connected in parallel. The four states are referred as the first state, second state, third state and fourth state hereinafter. The conditions for the four states will be described in the following.

The first phase change layer 10 and the second phase change layer 20 are different materials for phase change, which have distinct characteristics and preferably resistant differences. The crystallization and amorphization speed of the first phase change layer 10 and the second phase change layer 20 are also preferably different. For example, one of the two layers may employ a material with the characteristics of low resistance, high crystallization temperature and fast crystallization speed, while the other may employ a material with the characteristics of high resistance, low crystallization temperature and slower crystallization speed. In one embodiment, the materials of the first phase change layer 10 and the second phase change layer 20 are different. In another embodiment, the two layers may adopt the same phase change material. The technological effect of the four memory states may be achieved by forming the two single phase change cells in parallel through an optimized structural design.

For example, the first phase change layer 10 may employ doped eutectic SbTe, AgInSbTe or GeInSbTe. The second phase change layer 20 may employ GeSbTe compounds such as $Ge_2Sb_2Te_5$. The aforementioned materials are for illustration only, and are not intended to limit the composition of the invention. Two phase change layers with different resistant variations and crystallization/amorphization speeds may be obtained by changing the composition of the phase change layers, adjusting the thickness of the phase change layers, changing the top electrodes types and contact areas, or forming functional layers between the phase change layers and the top electrodes.

The bottom electrode 30 not only connects the first phase change layer 10 and the second phase change layer 20 for conducting, but also helps heat sink. The material with stable chemical characteristics (not reacting with the phase change layers) and high heat conductivity may be employed, for example, TiN.

The materials of the first top electrode 41 and the second top electrode 42 may be the same as that of the bottom electrode 30. In one embodiment, for simplifying the fabricating process, the materials of the first top electrode 41 and the second top electrode 42 may be the same as that of the bottom electrode 30. In another embodiment, the size of the first top electrode 41 and the second top electrode 42 may be the same. In yet another embodiment, the size of the first top electrode 41 and the second top electrode 42 may be different. The size of the electrodes is adjusted to control the heating efficiency.

Figure 2:
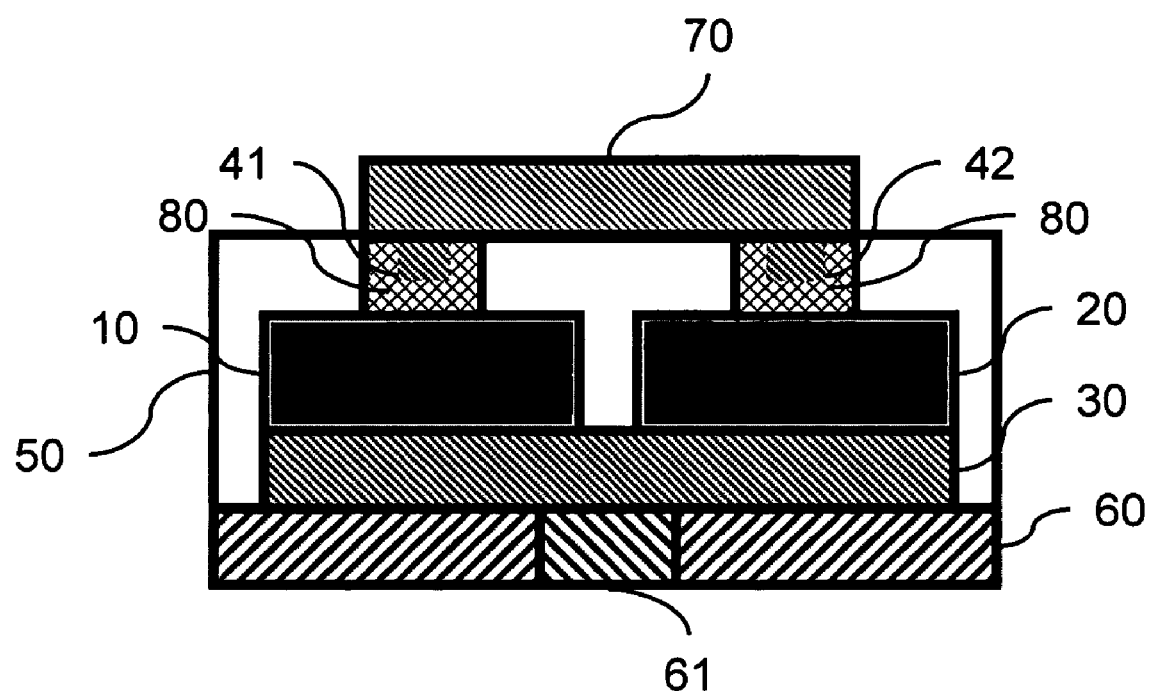
FIG. 2 is another structure diagram of the phase change memory element according to the invention.

According the principle of the invention, in one embodiment, a functional layer 80 is optionally formed between the first top electrode 41 and the first phase change layer 10 or the second top electrode 42 and the second phase change layer 20. As illustrated in FIG. 2, the functional layer 80 may be arranged with one or both layers. In one embodiment, the functional layer 80 may be a heating layer for increasing heating efficiency. In another embodiment, the functional layer 80 may be a nucleation accelerating layer for accelerating crystallization speed of the first phase change layer. In yet another embodiment, the functional layer 80 may be a diffusion stop layer for preventing diffusion between the first phase change layer and the first top electrode. The material of the functional layer 80 may employ refractory metal, conductible metallic carbide, intermetallic carbide, metallic nitride, intermetallic nitride, metallic carbonitrid, or intermetallic carbonitride. The functional layer 80 may have one, two or all functions listed above according the characteristics of the materials.

In one embodiment, the provided phase change memory element selects the cell to be written in or read out through a selecting element, which may be, for example, MOSFET 110, or diode 120, or BJT, The transistor connects with the bottom electrode 30 through the metal contact 61. Sufficient heat for phase change of the first phase change layer 10 and the second phase change layer 20 is generated by imposing voltages on the heater, or the first top electrode 61 and the second top electrode 30. Then the signals are delivered to the receiving ends and sensing amplifier through the top and bottom electrodes. According to the principle of the invention, the operation of the multilevel phase change memory element is controlled by imposing voltages and imposing time.

Refer to FIGS. 3A~3I, which illustrate the fabricating process of the phase change memory element according to the invention. In the embodiment, the phase change layers employ the same material. Composition of one of the phase change layers is converted by ion implantation.

Figure 3A:
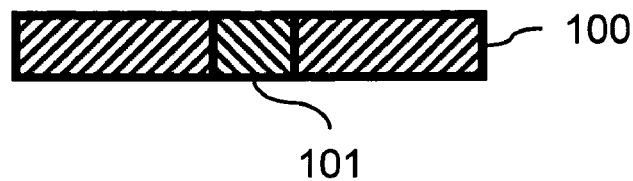
FIG. 3A~FIG. 3I illustrate the fabricating process of the phase change memory element according to the invention.
Figure 3B:
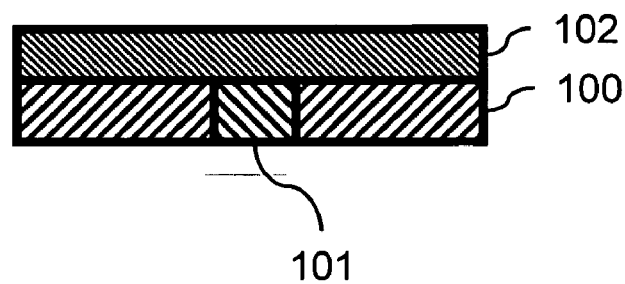
Figure 3C:
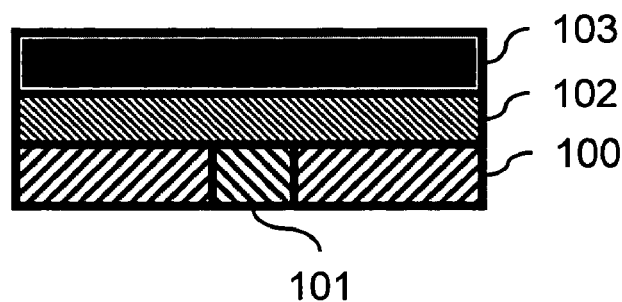
Figure 3D:
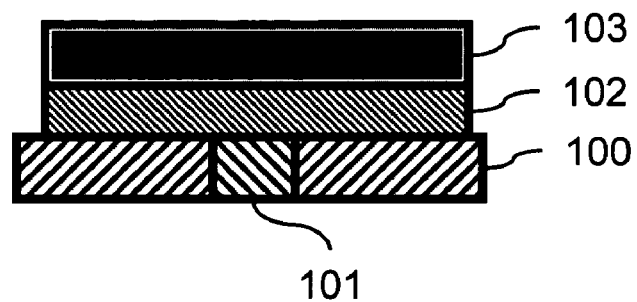

A substrate 100, in which a metal contact 101 is formed, is provided in the former manufacturing process for CMOS or bipolar. A bottom electrode 102 is formed on the substrate 100. Then the phase change layer 103 is deposited and the bottom electrode 102 and the phase change layer 103 is etched, as shown in FIGS. 3A~FIG. 3B. The phase change layer 103, for example, may employ eutectic SbTe having 16 at. %~37 at. % composition of Te.

Figure 3E:
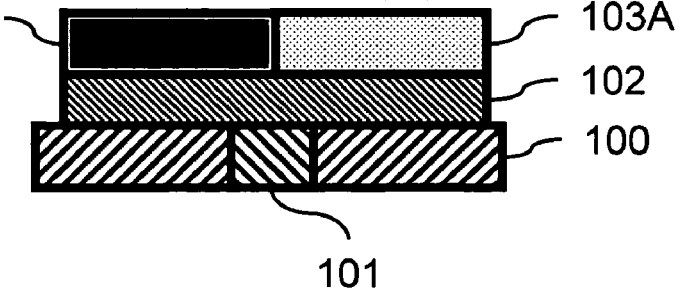

Then, one portion of the phase change layer 103 is ion implanted to change the chemical composition. The implanted elements include III A group, IVA group, VA group, VIA group and rare-earth transition metals. After implanting, a first phase layer 103A and a second phase change layer 103B are formed, which are connected with each other, as illustrated in FIG. 3E.

Figure 3F:
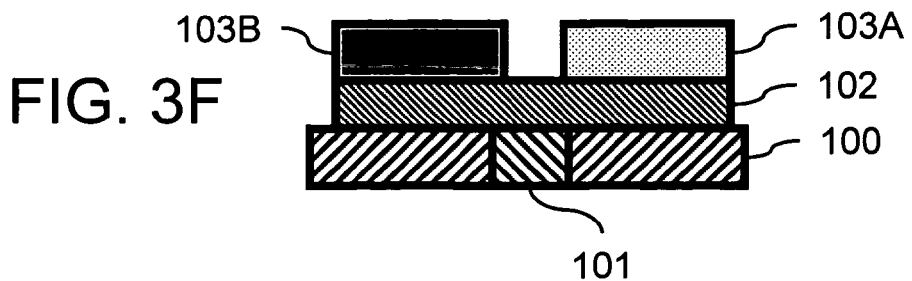

The phase change layer 103 (first phase change layer 103A and second phase change layer 103B which are connected with each other) is etched to separate the first phase change layer 103A and the second phase change layer 103B, as illustrated in FIG. 3F.

Figure 3G:
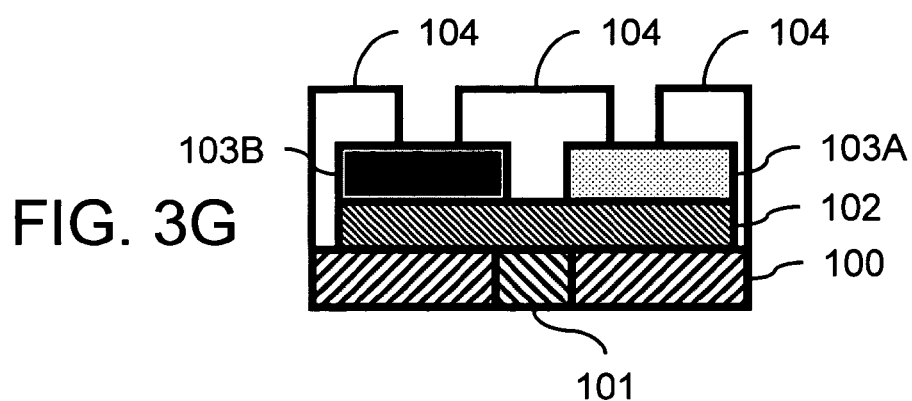
Figure 3H:
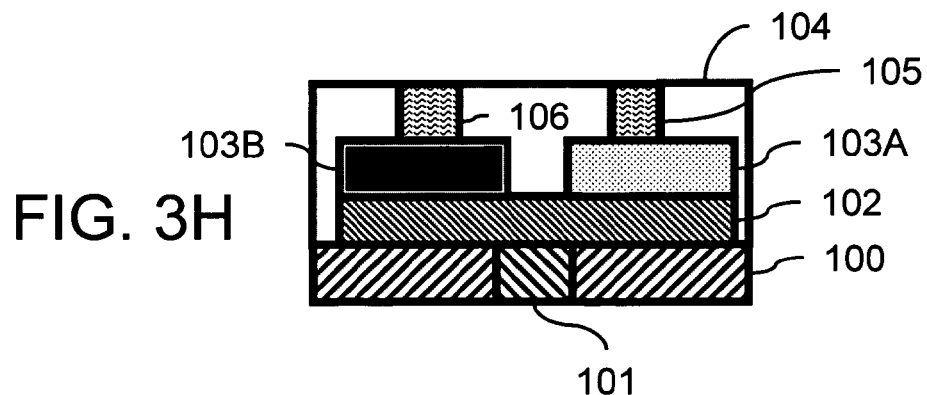
Figure 3I:
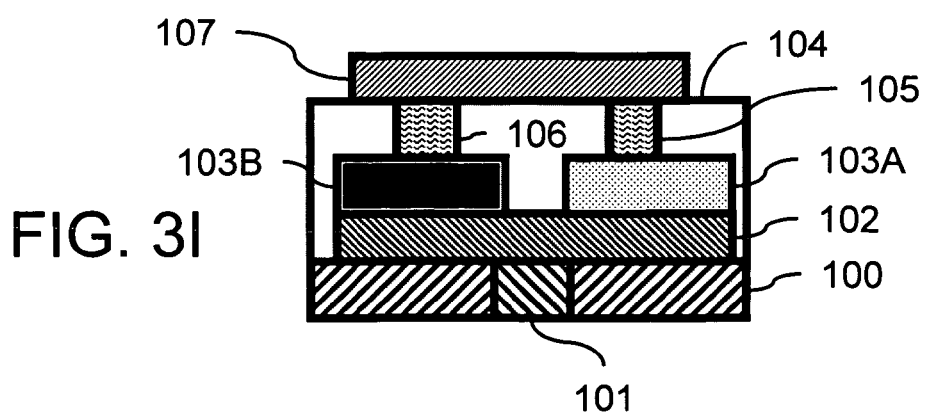

A dielectric layer 104 is then deposited for protection. The first top electrode 105 and the second top electrode 106 are deposited through masking and etching processes, as illustrated in FIGS. 3G~FIG. 3H. The surface of the dielectric layer 104 is polished and then deposited with a metal line 107, as illustrated in FIG. 3I. In one embodiment, the size of the first top electrode 105 and the second top electrode 106 is the same. In another embodiment, the size of the first top electrode 105 and the second top electrode 106 is different.

In another embodiment, a functional layer (referred to as the functional layer 80 in FIG. 2) may be formed between the first top electrode 105 and the first phase change layer 103A. The functional layer may be a heating layer for increasing heating efficiency, a nucleation accelerating layer for accelerating crystallization speed of the first phase change layer, a diffusion stop layer for preventing diffusion between the first phase change layer and the first top electrode or any combination of these layers. This functional layer is also optionally formed between the second top electrode 106 and the second phase change layer 103B. It is noted that one or two functional layers may be adopted.

Refer to FIG. 4, which illustrates the fabricating process of the phase change memory element according to the invention. In the embodiment, the phase change layers employ different materials.

Figure 4A:
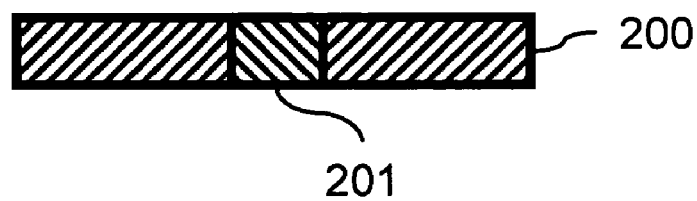
FIG. 4A~FIG. 4G illustrate the fabricating process of the phase change memory element according to the invention.
Figure 4B:
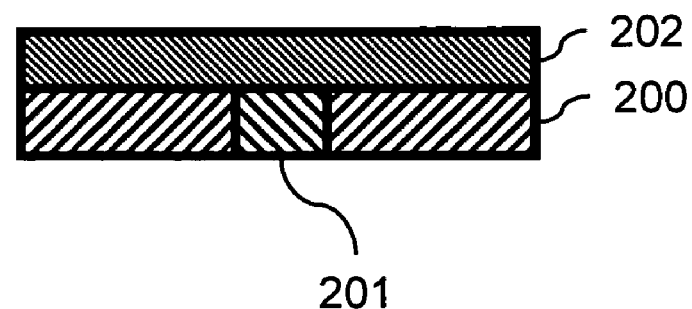
Figure 4C:
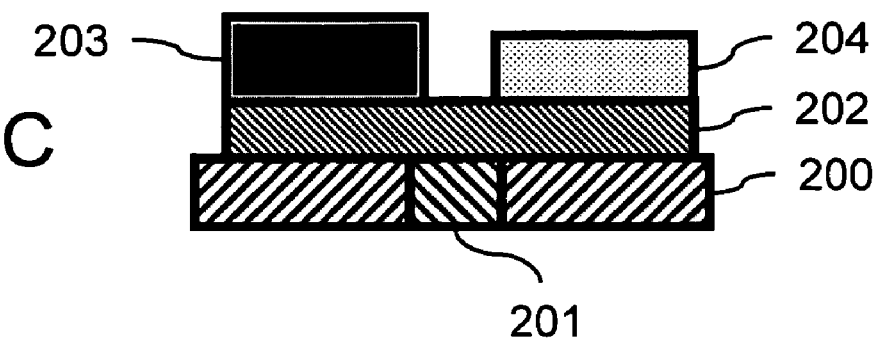
Figure 4D:
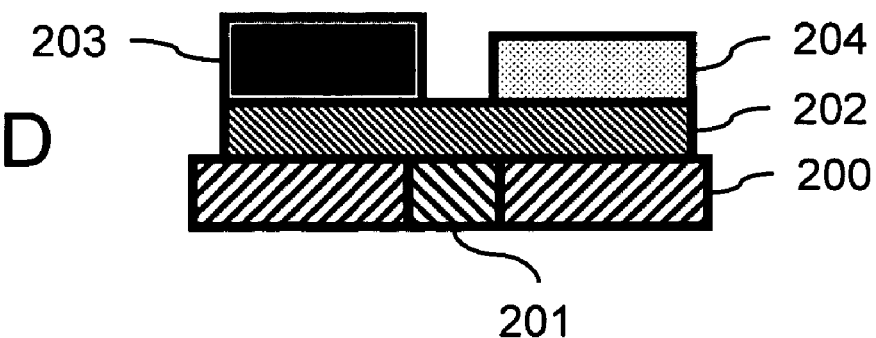

A substrate 200, in which a metal contact 201 is formed, is provided in the former manufacturing process for CMOS or bipolar. A bottom electrode 202 is formed on the substrate 200. The first phase change layer 203 and the second phase change layer 204 are then deposited, as shown in FIGS. 4A and FIG. 4D. The materials of the phase change layers may employ doped eutectic SbTe or GeSbTe compounds. In one embodiment, the thickness of the first phase change layer 203 and the second phase change layer 204 may be the same. In another embodiment, the thickness of the first phase change layer 203 and the second phase change layer 204 may be different.

Figure 4E:
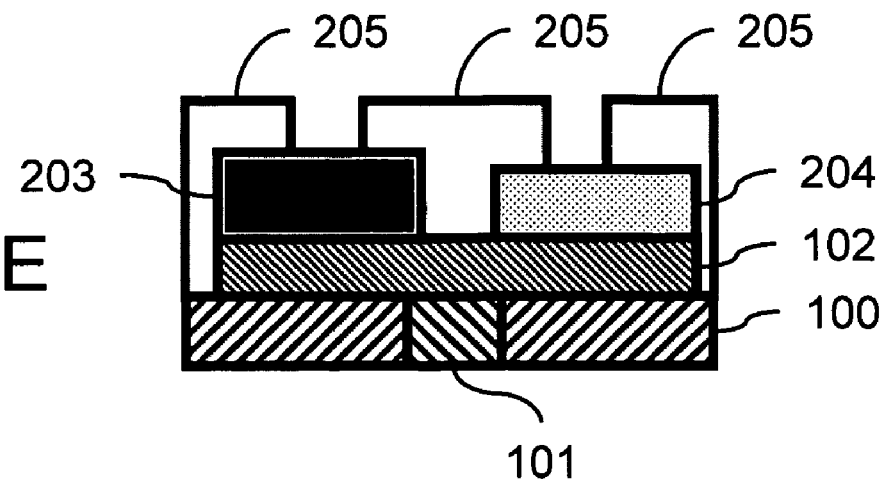
Figure 4F:
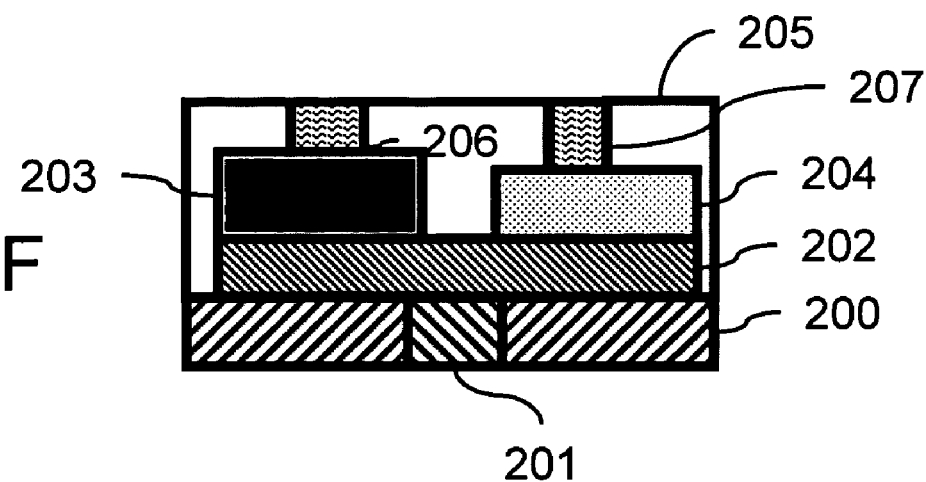
Figure 4G:
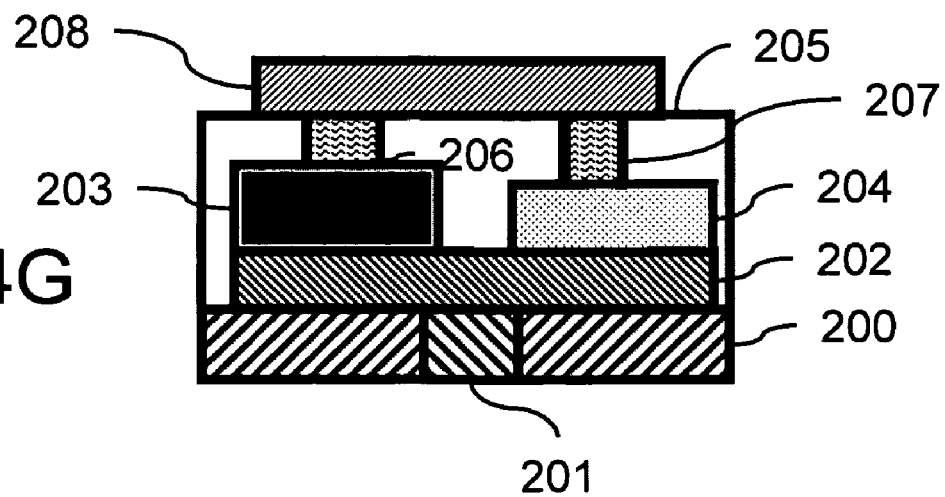
Figure 5A:
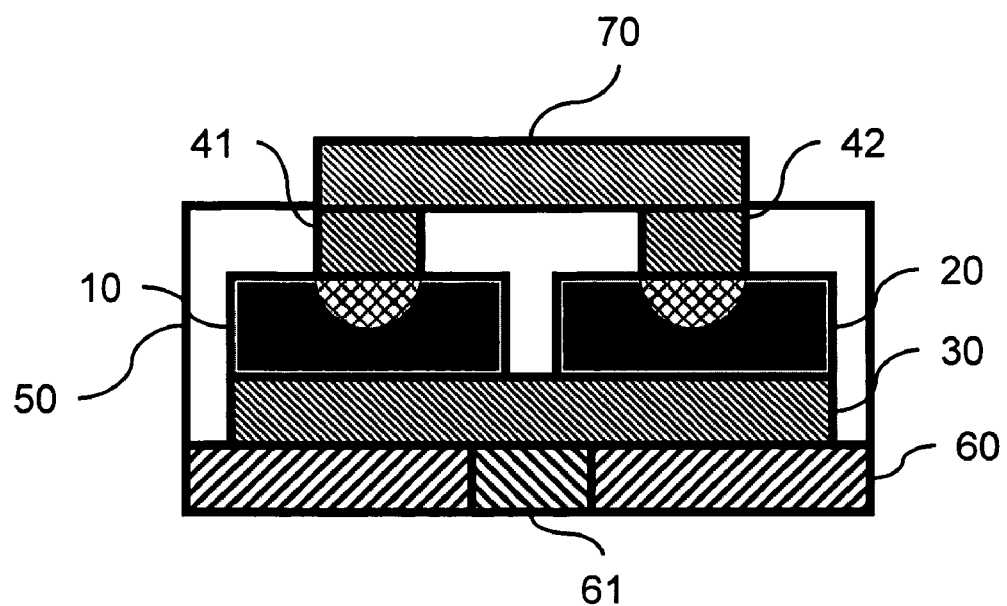
FIG. 5A~FIG. 5D are the illustrative diagrams of the four memory states of the phase change memory element according to the invention.
Figure 5B:
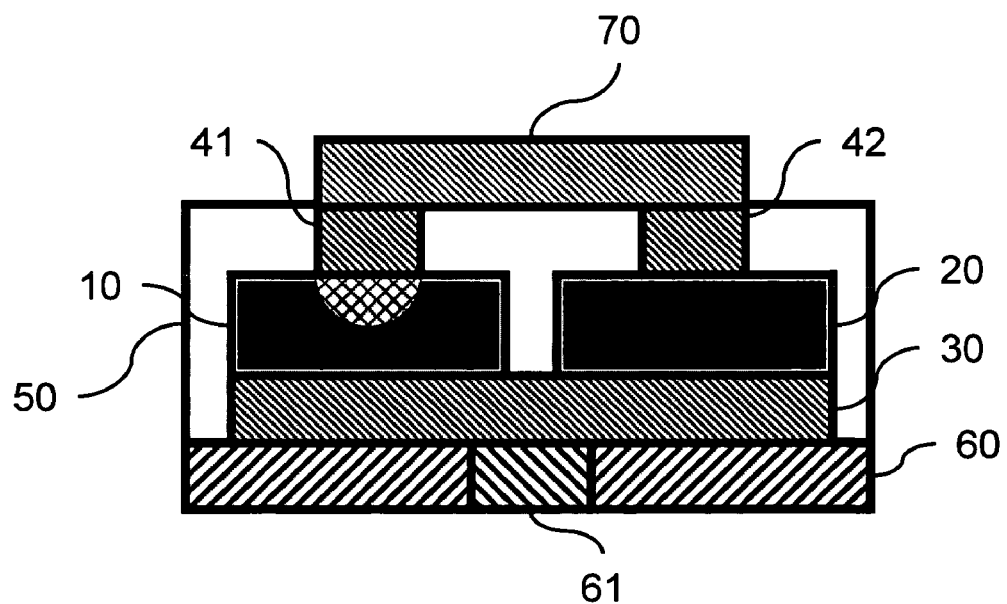
Figure 5C:
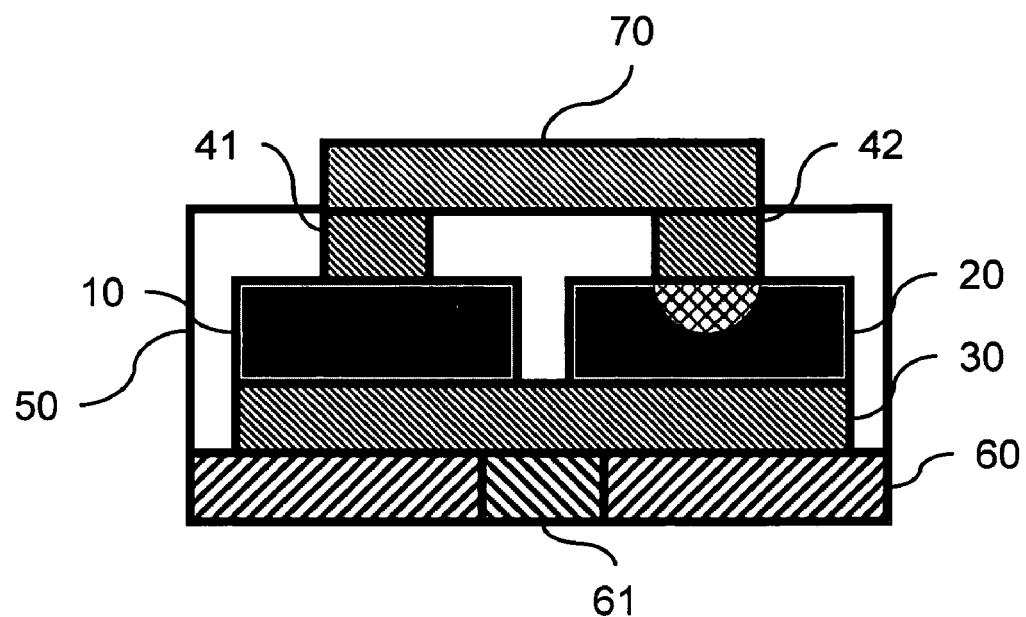
Figure 5D:
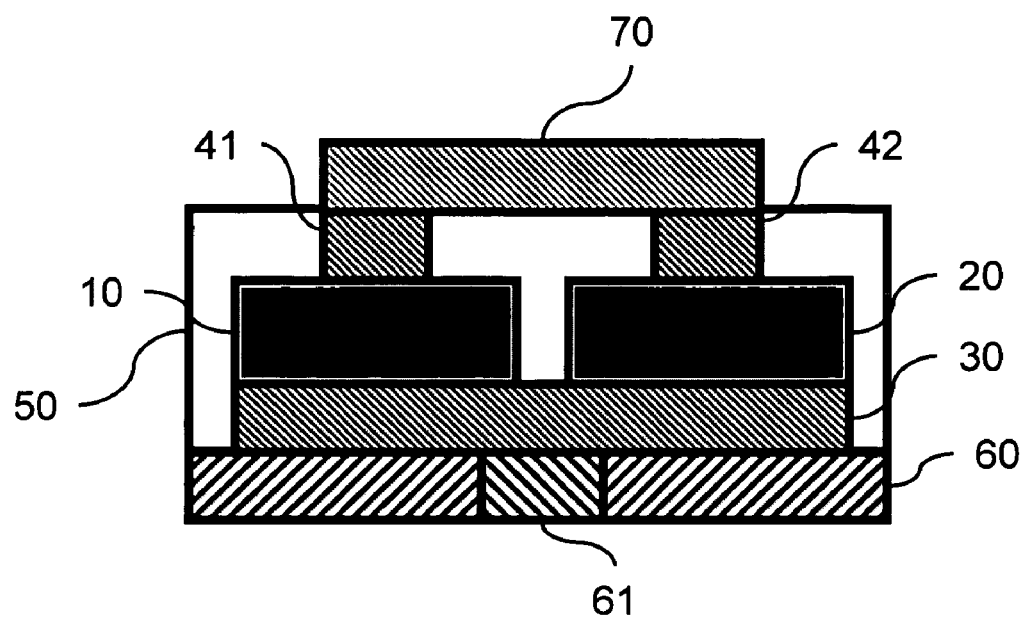
Figure 6A:
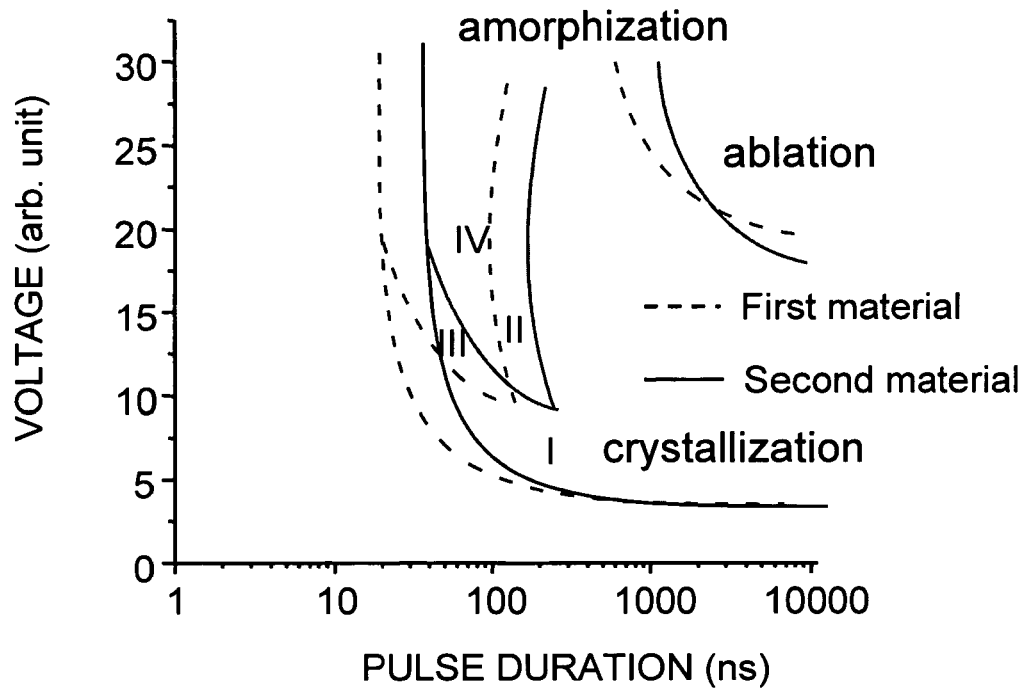
FIG. 6A~FIG. 6D are the characteristic diagrams of the four memory states of the phase change memory element according to the invention.
Figure 6B:
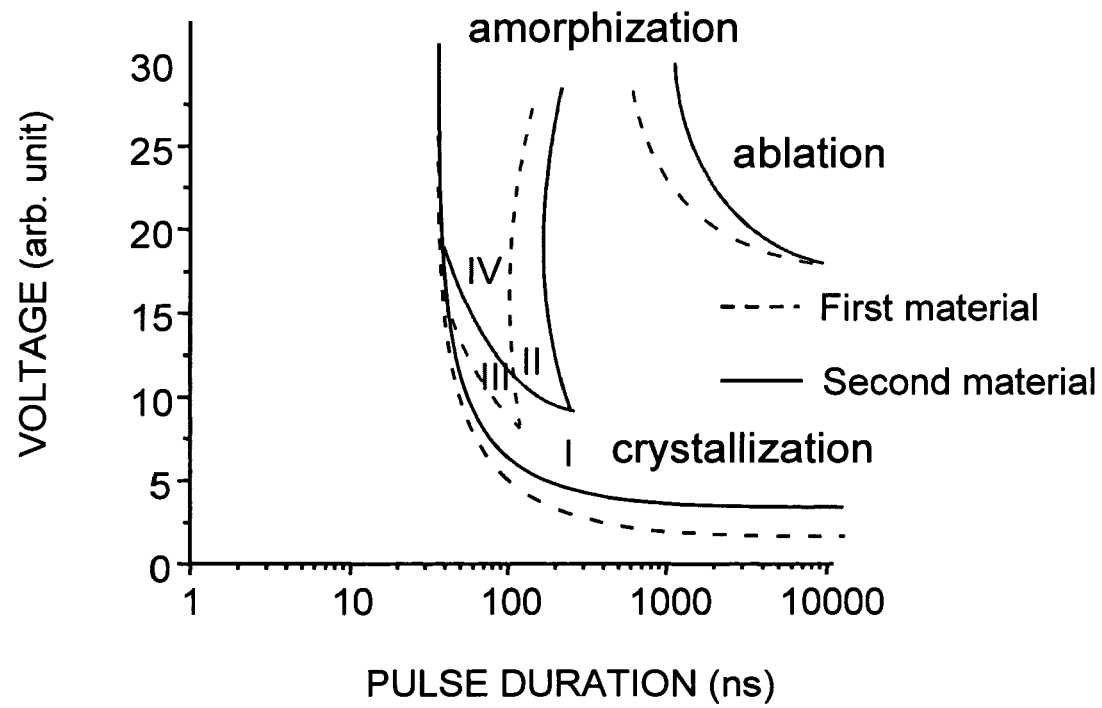
Figure 6C:
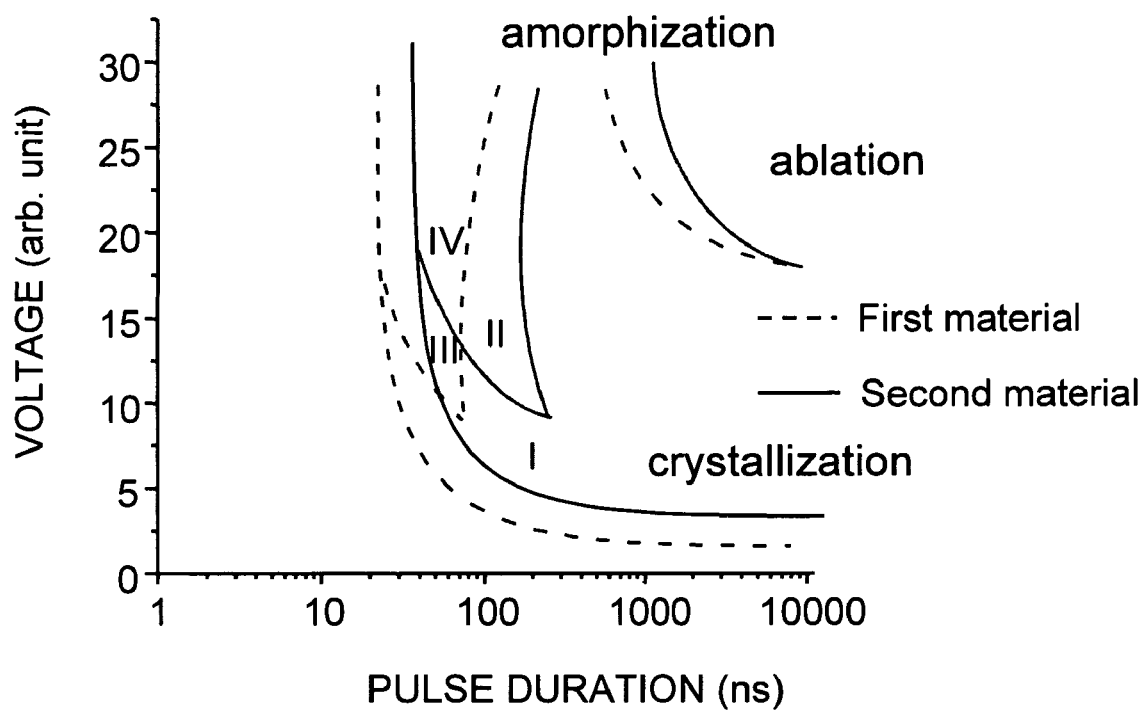
Figure 6D:
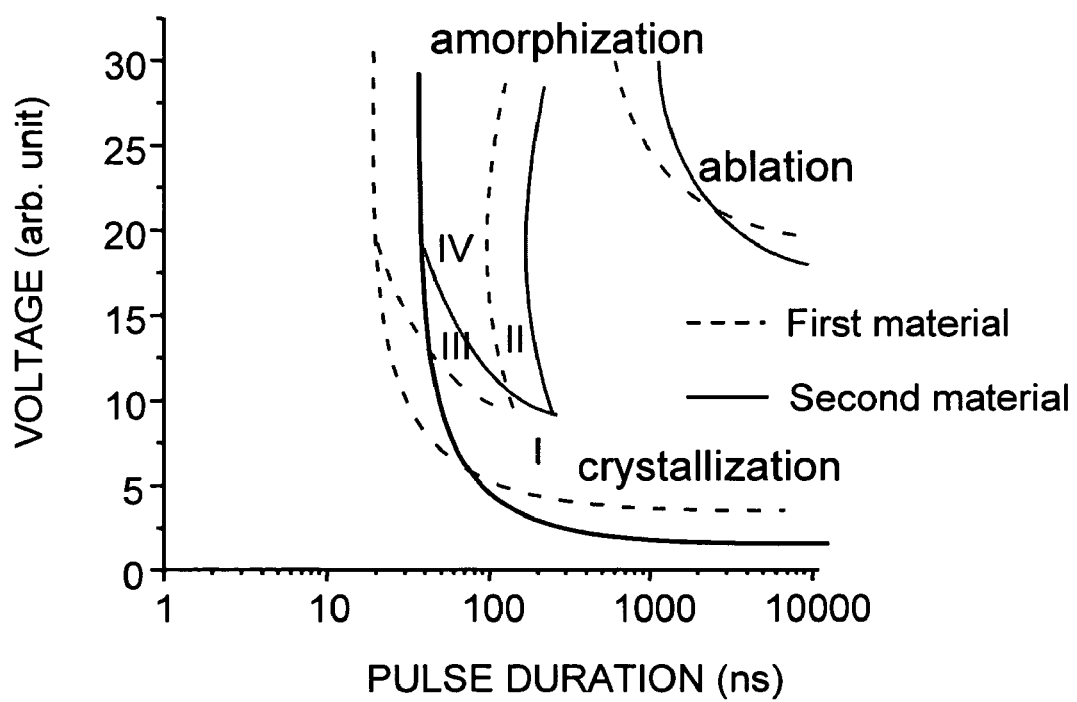

A dielectric layer 205 is then deposited for protection. The first top electrode 206 and the second top electrode 207 are deposited through masking and etching processes, as illustrated in FIG. 4E~FIG. 4F. The surface of the dielectric layer 205 is polished and then deposited with a metal line 208, as illustrated in FIG. 4G. In one embodiment, the size of the first top electrode 206 and the second top electrode 207 is the same. In another embodiment, the size of the first top electrode 206 and the second top electrode 207 is different.

In another embodiment, a functional layer (referred to as the functional layer 80 in FIG. 2) may be formed between the first top electrode 206 and the first phase change layer 203. The functional layer may be a heating layer, a nucleation accelerating layer for accelerating crystallization speed of the first phase change layer, a diffusion stop layer for preventing diffusion between the first phase change layer and the first top electrode or any combination of these layers. This functional layer is also optionally formed between the second top electrode 207 and the second phase change layer 204. It is noted that one or two functional layers may be adopted.

The operation of the phase change memory element in accordance with the invention is illustrated as follows. Refer to FIG. 5A to FIG. 5D.

The phase change memory element in accordance with the invention employs a voltage-drive mode in operation. The first phase change layer 10 and the second phase change layer 20 are heated by imposing different voltages on the first top electrode 41 and the second top electrode 42. Then the first phase change layer 10 and the second phase change layer 20 generate zero, one, or two amorphous volumes because of the material characteristics. In the invention, two amorphous volumes are referred as the fourth state; an amorphous volume is referred as the second state and third state; no amorphous volume is referred as the first state. The schematic diagram of all the states is illustrated in FIG. 5A~FIG. 5D. The phase change layer with amorphous volumes has the highest resistance. Therefore, the parallel resistance of the fourth state is the highest; the second highest is the third state, the third highest is the second state and the first state's resistance is lowest. Four resistance levels correspond to four memory states, thereby achieving four memory states.

According to the principle of the invention, the physical parameters of the materials of the first phase change layer 10 and the second phase change layer 20 are provided in TABLE I, in which the first material is applied for the first phase change layer 10, while the second material is applied for the second phase layer 20, or vice versa.

The materials listed hereinafter are exemplary and explanatory and are not intended to limit the materials for the phase change memory element of the invention. Therefore, people skilled in the related art may obtain a phase change memory element with four memory states through selecting proper materials.

TABLE I

|  | FIRST MATERIAL | SECOND MATERIAL |
|---|---|---|
| Crystallization resistance (Ω-cm) | $5 \times 10^{-3}$ | $1 \times 10^{-2}$ |
| Amorphization resistance (Ω-cm) | 50 | 100 |
| Crystallization Temperature (° C.) | 190 | 150 |
| Melting point (° C.) | 570 | 610 |
| Specific heat (J/cm$^3$K) | ~1.0 | ~1.0 |
| Thermo-conductivity coefficient (W/cmK) | 0.17 | 0.14 |

The amorphous volumes of the first material and the second material are supposed to be the same. The ratio of the thickness and the crystallized area is 1:9. The size of the heating electrodes is the same. The total resistance for each state is estimated as follows.

<FIRST STATE>

The first phase change layer and the second phase change layer crystallize.

$$1/R1=1/[(5\times10-3)\times10]+1/[(1\times10-2)\times10]\sim30,$$
$$R1=0.03$$

<SECOND STATE>

The first phase change layer crystallizes, and the second phase change layer amorphizes.

$$1/R2=1/[(5\times10-3)\times10]+1/[100\times1+(1\times10-2)\times9]\sim20,$$
$$R2=0.05$$

<THIRD STATE>

The first phase change layer amorphizes, and the second phase change layer crystallizes.

$$1/R3=1/[50\times1+(5\times10-3)\times9]+1/[(1\times10-2)\times10]\sim10,$$
$$R3=0.1$$

<FOURTH STATE>

The first phase change layer and the second phase change layer amorphize.

$$1/R4=1/[50\times1+(5\times10-3)\times9]+1/[100\times1+(100\times1+(1\times10-2)\times9]\sim0.03, R4=33.3$$

From the estimation, the total resistance is determined by the resistance of the amorphized area. The total current is I4=0.03V, I3=10V, I2=20V, and I1=30V, respectively, when imposing voltage V. Therefore, the memory state may be determined by reading out the current of the memory.

Refer to FIGS. 6A to 6D for the characteristic curves of the supposed conditions listed above. Areas I, II, III, and IV in the figures may be obtained by selecting proper materials or adjusting sizes of the structures.

A voltage pulse test of single phase change cell is conducted for the first material and the second material. The conditions for amorphization and crystallization may be obtained by modulating voltage (V) and time (t). A crystallized cell is employed for an amorphization test, while a written cell is employed for a crystallization test. The test results are shown in the V-t diagram, which has an amorphization area, a crystallization area, and an ablation area. The amorphization area and the crystallization area of each phase change material may be adjusted to not totally overlap by adjusting the structural parameters of the memory cell. Thus, there are multiple correspondent relationships according to different phase change materials. For example, a higher crystallization temperature has a higher bottom edge of the crystallization area; a higher melting point has a higher bottom edge of the amorphization area; a faster crystallization speed has a front edge of the crystallization area and the amorphization area.

When two memories are connected in parallel and the voltage pulse (V, t) falls in the overlapped amorphization area (AREA IV), each phase change layer has an amorphous volume. When the voltage pulse (V, t) falls in the amorphization area of the first material and does not overlap with the amorphization area of the second material (AREA III), the first phase change layer has an amorphous volume while the second phase change layer does not act. When the voltage pulse (V, t) falls in the amorphization area of the second material and does not overlap with the amorphization area of the first material (AREA II), only the second phase change layer generates an amorphous volume, while the first phase change layer melts, cools down smoothly and then crystallizes. When the voltage pulse (V, t) falls in the overlapped crystallization area (AREA I), the two phase change layers crystallize no matter which state they are in.

Different first materials and second materials are selected for testing by adjusting structural parameters properly, and the obtained results are illustrated in FIGS. 6A~6D. From the results illustrated in these figures, four memory states formed by two phase change layers are obtained.

According to the principle of the invention, two methods may be adopted for the operation of the phase change memory element when transferring different memory states.

The two methods are referred as zero mode and direct overwrite mode hereinafter. The memory states (second, third and fourth sate) are returned to zero, i.e., the first state (the first phase change layer and the second phase change layer crystallize) for the operation of the zero mode, and are transferred to another memory state. The operation is given in as follows.

A two-stage operation is used in the zero mode operation. For any state transformation, a first pulse is imposed on the first phase change layer and the second phase change layer such that the first phase change layer and the second phase change layer crystallize to return to the first state. Then a second pulse is imposed to change the crystallization of the first phase change layer and the second phase change layer according to the memory condition.

Detailed operations are described as follows, referring to FIG. 7.

Figure 7:
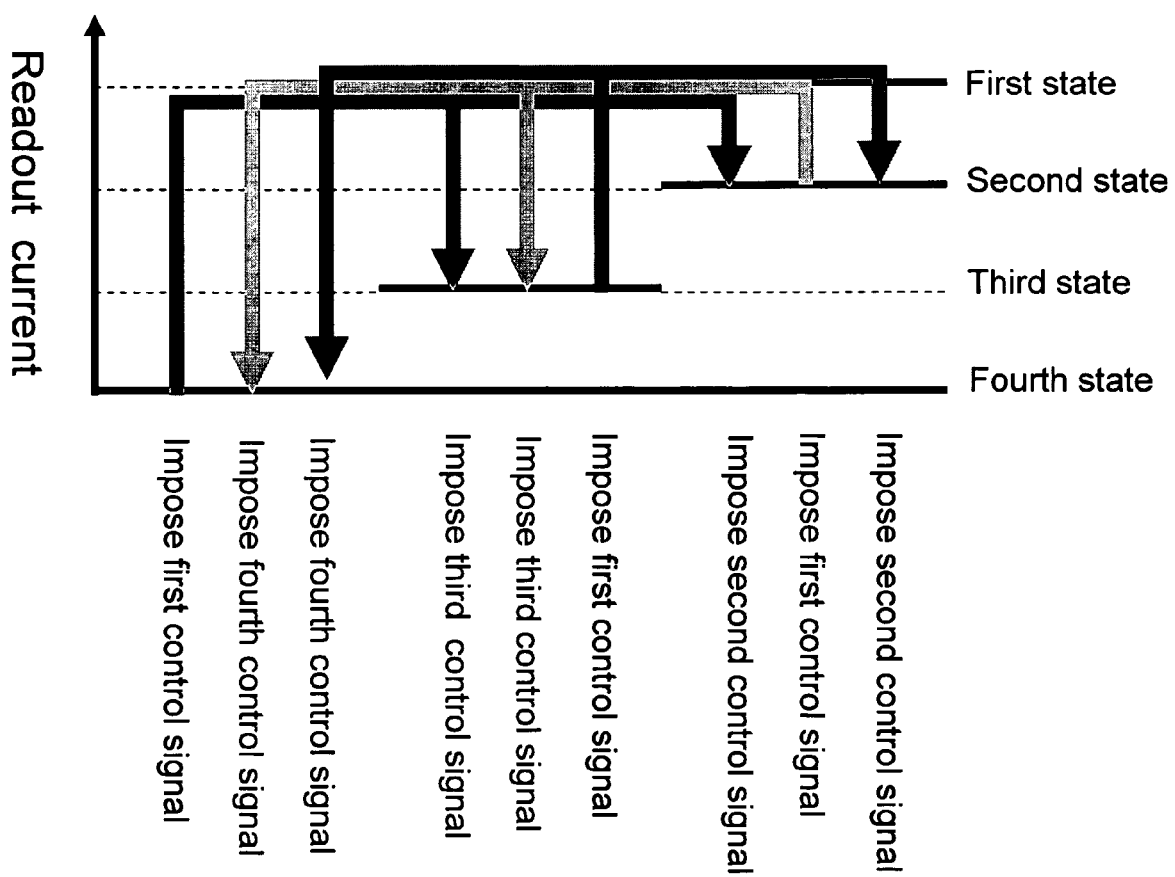
FIG. 7 illustrates the operation for memory state transferring of the phase change memory element according to the invention.

The Y axis in FIG. 7 refers to read out currents, in which the highest represents the first state, the second state, the third state, and the fourth state in turn. The arrow direction represents the control signals for different memory states. According to the principle of the invention, energy for each memory state is different. Therefore, four control signals are needed according to the resistance of each state. The signals are referred to as the first control signal, the second control signal, the third control signal, and the fourth control signal, which correspond to the first state, the second state, the third state, and the fourth state, respectively.

The control signals corresponding to the state transformation of the phase change layers are listed in TABLE II.

TABLE II

| control signal | state | first phase change layer | second phase change layer |
|---|---|---|---|
| first control signal | first | crystallization | crystallization |
| second control signal | second | crystallization | amorphization |
| third control signal | third | amorphization | crystallization |
| fourth control signal | fourth | amorphization | amorphization |

When imposing the first control signal, the first phase change layer and the second phase change layer turn to a crystalline state (first state). When imposing the second control signal, the layers turn to the second state. When imposing the third control signal, the layers turn to the third state. When imposing the fourth control signal, the layers turn to the fourth state.

As illustrated in FIG. 7, when transforming to the second state from the third state, the first control signal is imposed in the beginning such that the cell turns to the first state, and then the second control signal is imposed such the cell turns to the second state. In another embodiment, when transforming to the second state from the fourth state, the first control signal is imposed in the beginning such that the cell turns to the first state, and then the fourth control signal is imposed such the cell turns to the fourth state. Accordingly, in zero mode operation, two signals are needed to change the memory state. The first pulse is imposed to return the state to zero, and the second pulse is imposed such that the cell turns to the desired state.

According to the principles of the invention, the control signals for the zero mode operation are fewer. Operation is easier, and there is no problem of incomplete crystallization of the amorphization volume.

In another embodiment, the method is direct overwrite mode. The aforementioned zero operation is not necessary for the direct overwrite mode during state transformation.

Similarly, four control signals are needed, which are listed in TABLE III.

TABLE III

| control signal | state | first phase change layer | second phase change layer |
|---|---|---|---|
| first control signal | first | crystallization | crystallization |
| second control signal | second | crystallization | amorphization |
| third control signal | third | amorphization | crystallization |
| fourth control signal | fourth | amorphization | amorphization |

When imposing the first control signal, the first phase change layer and the second phase change layer turn to a crystalline state (first state). When imposing the second control signal, the layers turn to the second state. When imposing the third control signal, the layers turn to the third state. When imposing the fourth control signal, the layers turn to the fourth state.

Figure 8:
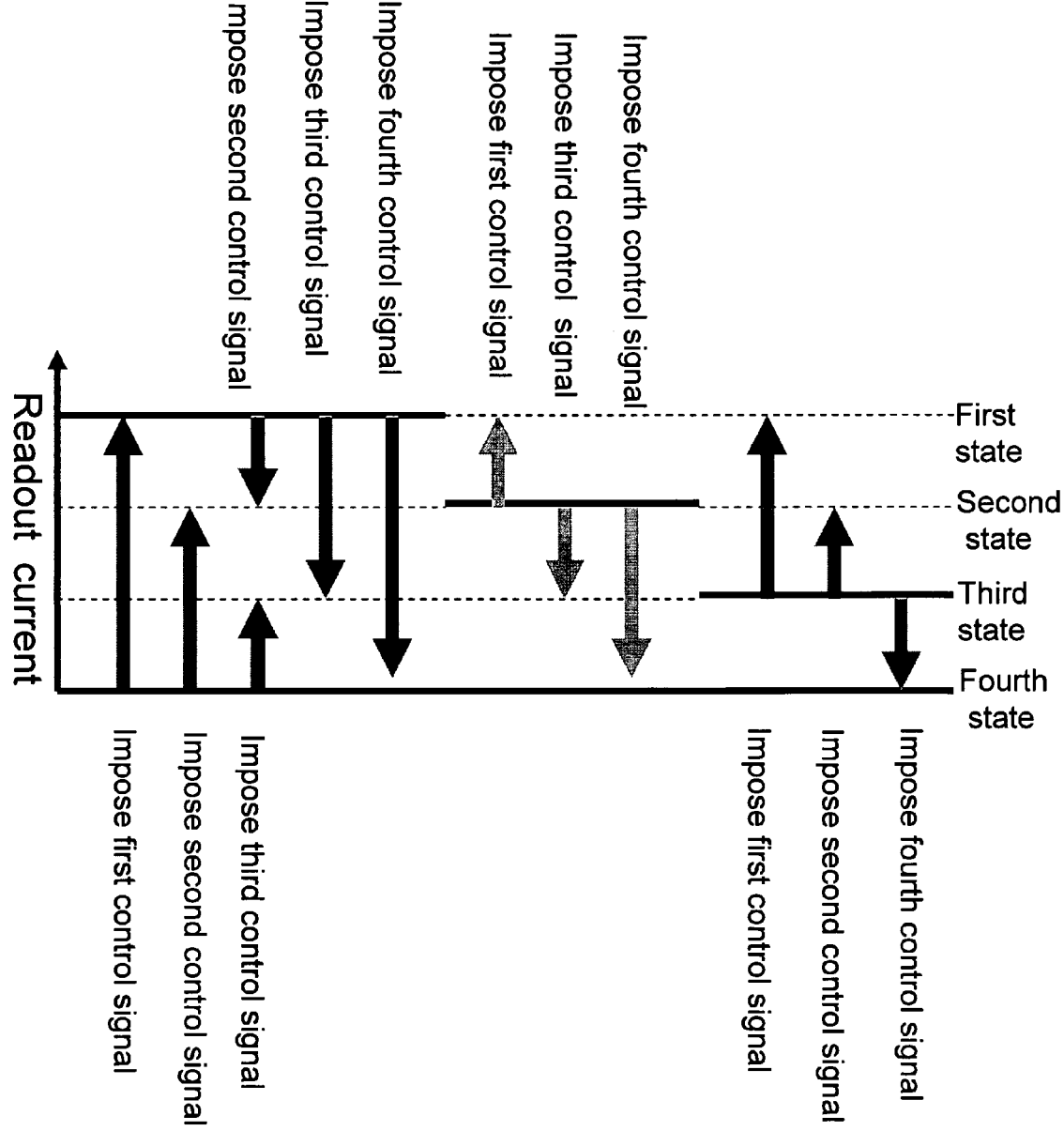
FIG. 8 illustrates the operation for memory state transferring of the phase change memory element according to the invention.

As illustrated in FIG. 8, when transforming to the second state from the third state, only the second control signal is imposed. In another embodiment, when transforming to the fourth state from the second state, only the fourth control signal is imposed. Therefore, in direct overwrite mode, only one pulse is necessary for state transformation. The direct overwrite mode has the advantage of short transformation time, and the original memory state does not need to be detected first before transformation.

According to the aspect and principle of invention, the multilevel memory cell is configured by two independent single phase change cells connected in parallel, which use the same drive voltage for writing and reading different resistance levels.

The two independent phase change cells are configured to obtain two voltage-pulse (V-t) diagrams for state transformation operations in zero mode or direct overwrite mode.

In one embodiment, the two independent phase change cells adopt one or two different phase change materials. In another embodiment, the materials of the heating electrodes or the contact areas of the electrodes are changed to adjust the current density to control heating efficiency. In one embodiment, a heating layer is formed between the electrode and the respective phase change layer to increase heating efficiency. In another embodiment, the thickness of the phase change layer and the bottom electrode (metal heat-conducting layer) is adjusted to control heat radiating efficiency. For example, when a material with lower resistance at the crystalline state is employed, a heating layer is formed or contact areas of the electrodes are reduced for increasing heating efficiency. In one embodiment, if the material needs faster critical cooling speed, it may be achieved by decreasing the thickness of the phase change layer or increasing the thickness of the bottom electrode.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A phase change memory element comprising:
   a first phase change layer either in a crystalline state or in an amorphous state;
   a second phase change layer either in a crystalline state or in an amorphous state;
   a first top electrode and a second top electrode formed on one surface of the first phase change layer and the second phase change layer respectively, the first and second top electrodes being electrically connected in parallel for delivering electrical signals to change states of the first phase change layer and the second phase change layer; and
   at least one bottom electrode connected to further surfaces of the first phase change layer and the second phase change layer respectively, the at least one bottom electrode being electrically connected to the first and second phase change layers in parallel and leading to a selecting component.

2. The memory element of claim 1, wherein materials of the first phase change layer and the second phase change layer are the same.

3. The memory element of claim 1, wherein materials of the first phase change layer and the second phase change layer are different.

4. The memory element of claim 1, wherein materials of the first top electrode and the second top electrode are the same.

5. The memory element of claim 1, wherein materials of the first top electrode and the second top electrode are different.

6. The memory element of claim 1, wherein a contact area of the first top electrode and the first phase change layer is the same as a contact area of the second top electrode and the second phase change layer.

7. The memory element of claim 1, wherein a contact area of the first top electrode and the first phase change layer is different from a contact area of the second top electrode and the second phase change layer.

8. The memory element of claim 1, wherein the at least one bottom electrode comprises a single electrode connected to the first phase change layer and the second phase change layer.

9. The memory element of claim 1, wherein the at least one bottom electrode comprises two electrodes connected to the first phase change layer and the second phase change layer respectively.

10. The memory element of claim 9, wherein materials of the two bottom electrodes are the same.

11. The memory element of claim 9, wherein materials of the two bottom electrodes are different.

12. The memory element of claim 1, further comprises a function layer between the first top electrode and the first phase change layer.

13. The memory element of claim 12, wherein the function layer comprises at least one of a heating layer for increasing heating efficiency, a nucleation accelerating layer for accelerating crystallization speed of the first phase change layer, and a diffusion stop layer for preventing diffusion between the first phase change layer and the first top electrode.

14. The memory element of claim 1, further comprises a function layer between the second top electrode and the first phase change layer.

15. The memory element of claim 12, wherein the function layer comprises at least one of a heating layer for increasing heating efficiency, a nucleation accelerating layer for accelerating crystallization speed of the second phase change layer, and a diffusion stop layer for preventing diffusion between the first phase change layer and the second top electrode.

16. A state transformation method for the phase change memory element of claim 1, comprising:
imposing a pulse to make both the first phase change layer and the second phase change layer amorphous showing a highest readout resistance;
imposing a pulse to make the first phase change layer amorphous and the second phase change layer crystalline showing a first intermediate readout resistance;
imposing a pulse to make the first phase change layer crystalline and the second phase change layer amorphous, showing a second intermediate readout resistance that is lower than the first intermediate resistance; and
imposing an electrical pulse to make both the first phase change layer and the second phase change layer crystalline showing a lowest readout resistance.

17. The state transformation method of claim 16, wherein the imposed pulse is a voltage pulse.

18. The memory element of claim 2, wherein the materials of the first phase change layer and the second phase change layer are doped eutectic SbTe composition.

19. The memory element of claim 2, wherein the materials of the first phase change layer and the second phase change layer are GeSbTe composition.

20. The memory element of claim 3, wherein the material of the first phase change layer is doped eutectic SbTe composition and the material of the second phase change layer is GeSbTe composition.

21. The memory element of claim 1, wherein the states include a first state when the first phase change layer and the second phase change layer are in the crystalline state, a second state when the first phase change layer is in the crystalline state and the second phase change layer is in the amorphous state, a third state when the first phase change layer is in the amorphous state and the second phase change layer is in the crystalline state, and a fourth state when the first phase change layer and the second phase change layer are in the amorphous state.

22. The memory element of claim 1, wherein the selecting component is a transistor.

23. A phase change memory element, comprising;
a first phase change layer that is either in a crystalline state or in an amorphous state, the first phase change layer having top and bottom ends;
a second phase change layer that is either in a crystalline state or in an amorphous state, the first phase change layer having top and bottom ends;
top means for permanently electrically connecting the top ends of the first and second phase change layers; and
bottom means for permanently electrically connecting the bottom ends of the first and second phase change layers.

* * * * *

UNITED STATES PATENT AND TRADEMARK OFFICE
CERTIFICATE OF CORRECTION

PATENT NO.         : 7,254,059 B2                                            Page 1 of 1
APPLICATION NO. : 11/182783
DATED              : August 7, 2007
INVENTOR(S)        : Chien-Ming Li et al.

It is certified that error appears in the above-identified patent and that said Letters Patent is hereby corrected as shown below:

Title page Item (73): Change Assignee's name from "Industrial Technology Research Institut" to --Industrial Technology Research Institute--.

Signed and Sealed this

Twenty-seventh Day of November, 2007

JON W. DUDAS
*Director of the United States Patent and Trademark Office*